(12) United States Patent
Ebefors et al.

(10) Patent No.: US 9,240,373 B2
(45) Date of Patent: Jan. 19, 2016

(54) SEMICONDUCTOR DEVICES WITH CLOSE-PACKED VIA STRUCTURES HAVING IN-PLANE ROUTING AND METHOD OF MAKING SAME

(71) Applicant: SILEX MICROSYSTEMS AB, Järfälla (SE)

(72) Inventors: Thorbjörn Ebefors, Huddinge (SE); Daniel Perttu, Hässelby (SE)

(73) Assignee: SILEX MICROSYSTEMS AB, Jarfalla (SE)

( * ) Notice: Subject to any disclaimer, the term of this patent is extended or adjusted under 35 U.S.C. 154(b) by 0 days.

(21) Appl. No.: 14/384,606

(22) PCT Filed: Mar. 12, 2013

(86) PCT No.: PCT/SE2013/050225
§ 371 (c)(1),
(2) Date: Sep. 11, 2014

(87) PCT Pub. No.: WO2013/137809
PCT Pub. Date: Sep. 19, 2013

(65) Prior Publication Data
US 2015/0028479 A1    Jan. 29, 2015

(30) Foreign Application Priority Data

Mar. 12, 2012    (SE) ...................... 1250228

(51) Int. Cl.
*H01L 21/66* (2006.01)
*H01L 23/498* (2006.01)
(Continued)

(52) U.S. Cl.
CPC .... *H01L 23/49816* (2013.01); *H01L 21/76879* (2013.01); *H01L 21/76898* (2013.01);
(Continued)

(58) Field of Classification Search
CPC ................. H01L 2224/023; H01L 2224/0231; H01L 2224/0233; H01L 2224/0237; H01L 2224/13024
USPC ........................................................ 257/691
See application file for complete search history.

(56) References Cited

U.S. PATENT DOCUMENTS

| 6,849,541 B1 | 2/2005 | Hu et al. |
| 7,985,620 B2 | 7/2011 | Kaskoun et al. |

(Continued)

FOREIGN PATENT DOCUMENTS

| EP | 1418617 A2 | 5/2004 |
| EP | 1926135 A2 | 5/2008 |
| WO | 2007/089206 A1 | 8/2007 |
| WO | 2010/059118 A1 | 5/2010 |
| WO | WO-2010059118 A1 | 5/2010 |

OTHER PUBLICATIONS

PCT International Search Report mailed Jul. 22, 2013 issued in a related PCT International Application No. PCT/SE2013/050225 (4 pages).

(Continued)

*Primary Examiner* — Yasser A Abdelaziez
*Assistant Examiner* — Hajar Kolahdouzan
(74) *Attorney, Agent, or Firm* — Carter, DuLuca, Farrell & Schmidt, LLP; Robert P. Michal, Esq.

(57) ABSTRACT

The invention relates to a semiconductor structure, comprising a substrate of a semiconductor material having a first side (FS) and an opposite second side (BS). There is at least one conductive wafer-through via (V) comprising metal, and at least one recess (RDL) provided in the first side of the substrate and in the semiconductor material of the substrate. The recess is filled with metal and seamlessly connected with the wafer-through via. The exposed surfaces of the metal filled via and the metal filled recess are essentially flush with the substrate surface on the first side of the substrate. There is also provide an interposer comprising the above structure, further comprising contacts for attaching circuit boards and integrated circuits on opposite sides of the interposer. A method of making the structure is also provided.

14 Claims, 14 Drawing Sheets

(51) Int. Cl.
  *H01L 23/14* (2006.01)
  *H01L 21/768* (2006.01)
  *H01L 23/48* (2006.01)
  *H01L 23/522* (2006.01)
  *H01L 23/525* (2006.01)

(52) U.S. Cl.
  CPC ............ *H01L23/147* (2013.01); *H01L 23/481* (2013.01); *H01L 23/49827* (2013.01); *H01L 23/5226* (2013.01); *H01L 23/525* (2013.01); *H01L 2224/02372* (2013.01); *H01L 2224/0401* (2013.01); *H01L 2224/05* (2013.01); *H01L 2224/0557* (2013.01); *H01L 2224/06181* (2013.01); *H01L 2224/13* (2013.01); *H01L 2224/13023* (2013.01); *H01L 2924/00013* (2013.01); *H01L 2924/00014* (2013.01); *H01L 2924/1461* (2013.01)

(56) References Cited

U.S. PATENT DOCUMENTS

| | | | |
|---|---|---|---|
| 8,598,714 | B2 | 12/2013 | Huisinga et al. |
| 8,628,057 | B2 | 1/2014 | Kirby et al. |
| 8,637,989 | B2 | 1/2014 | Lee et al. |
| 2003/0045085 | A1 | 3/2003 | Taniguchi et al. |
| 2003/0222350 | A1 | 12/2003 | Sawada |
| 2004/0018712 | A1 | 1/2004 | Plas et al. |
| 2009/0200662 | A1 | 8/2009 | Ng et al. |
| 2009/0243100 | A1 | 10/2009 | Akiyama |
| 2010/0258917 | A1 | 10/2010 | Lin |
| 2010/0264548 | A1 | 10/2010 | Sanders et al. |
| 2011/0147905 | A1 | 6/2011 | Utsumi et al. |

OTHER PUBLICATIONS

Communication dated Nov. 16, 2015 issued by the European Patent Office in relation to European Patent Application No. 13760504.4 (8 pages).

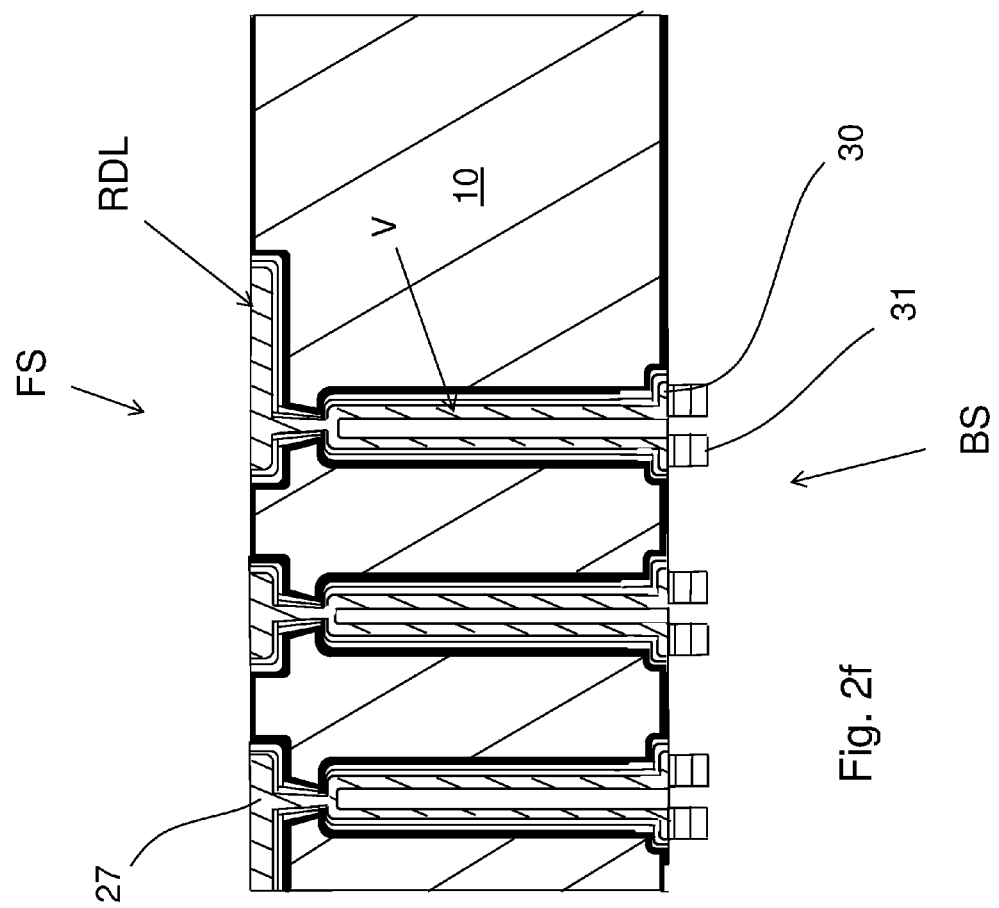

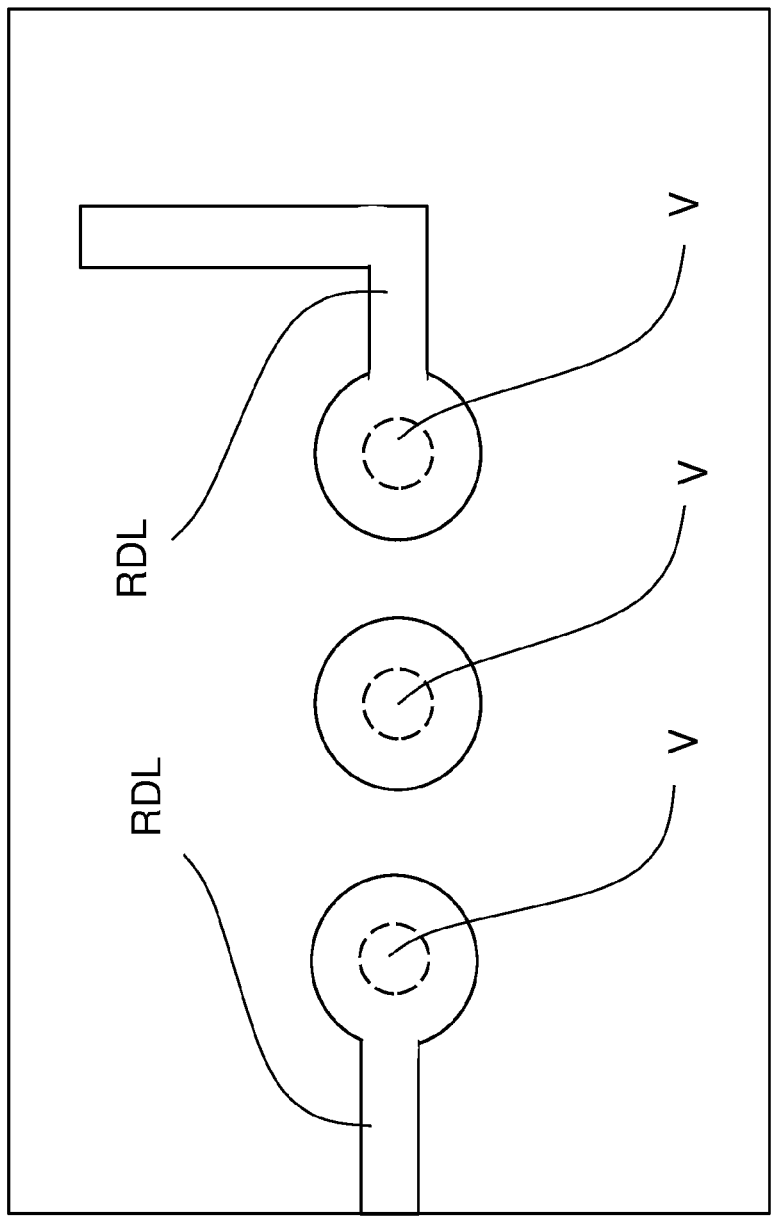

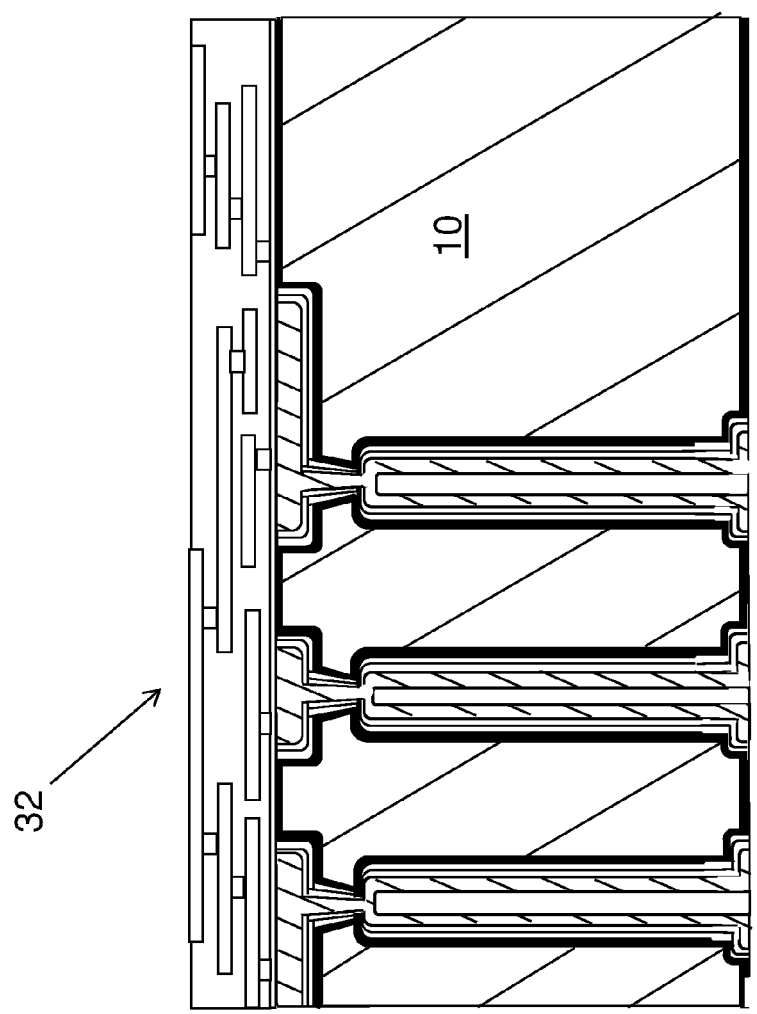

SEMICONDUCTOR DEVICES WITH CLOSE-PACKED VIA STRUCTURES HAVING IN-PLANE ROUTING AND METHOD OF MAKING SAME

CROSS-REFERENCE TO RELATED APPLICATIONS

This is a 371 national phase application of PCT International Application PCT/SE2013/050225 filed Mar. 12, 2013, which in turn claims benefit to Swedish Application No. 1250228-2, filed Mar. 12, 2012, the entire disclosure of each of which is incorporated herein by reference.

The present invention relates to MEMS (Micro electrical-mechanical systems) engineering, and in particular to the provision of high-density in-plane routing patterns in the surface of devices having close-packed via structures (Through Silicon Via (TSV) structures), whereby said thick routing patterns do not exhibit topography.

BACKGROUND OF THE INVENTION

In modern electronic devices such as mobile phones, computers etc. there is a continuous strive for miniaturization and close-packing of components. In the continuous strive of making micro components more densely packed, problems are encountered in particular where wafer through structures (also referred to as vias) are provided in very close proximity to each other. In particular where the vias are made from a material that is different from the substrate material in which they are provided, e.g. metal and silicon in the vias and substrate respectively, different thermal expansion effects may lead to substrates being subject to cracking and breaking during manufacturing, or other reliability issues during use.

Also, when vias are provided closer and closer, the requirement for routing signals over the substrate surface and in between above the vias becomes increasingly important. Thick Cu routing with reduced line width (CD) for improved performance (low R and C and ability to withstand high power density) is problematic.

Furthermore, routing patterns provided on the substrate surface will inevitably exhibit some degree of topography since the conductive material must have a finite thickness, and such topography can cause problems e.g. in the process of bonding wafers together, or when stacking several RDLs on top of each other for even more dense packaging (crossing of wires from different vias possible).

Among other things it is desirable to be able to stack chips carrying various devices on top of each other, so called interposers. Also, it is desirable to be able to provide so called redistribution layers, also referred to as routing structures, for signals coming from integrated circuits having large numbers of I/O contacts. Such contacts can be as many as several thousand on a chip of a size of the order of 10 mm square. If the signals are to be routed through the substrate, the through-substrate connections (vias) would have to be equally closely spaced. When such vias are made of metal and very closely spaced, thermal expansion effects due to different coefficients of expansion may cause damage to the very thin and brittle chips in which they are made. This frequently occurs both during processing but also in use in the end product, if it is subjected to temperature changes over large intervals. Also, the thickness of the substrate for such vias would have to be in the order of 100 μm, which is extremely thin and not practical for processing on both sides. Handling of such thin wafers requires carrier solutions, i.e. the wafer must be temporarily bonded to a thicker wafer to render it stable enough to be processed as desired.

Furthermore, in modern electronic devices such as mobile phones, the different thermal expansion coefficients for the various materials in the housing, the circuit boards, and the micro chips (MEMS, CMOS and the like), respectively, inevitably will cause problems unless relevant design measures are taken.

Thus, it is not suitable to provide routing by vias directly from each I/O point on a IC chip through the substrate on which the chip is mounted. Instead one provides for the above mentioned redistribution structures on the surface of the substrate on which the chip is mounted. The routings are "fanned out", i.e. the individual conductive strips diverge from the I/O points to a more widely spaced structure, where vias for routing through the substrate are provided for connectivity to the back-side of the interposer.

However, even with such precautions there will be a tendency for thermal stress in the interface between the I/O points and the substrate. To alleviate this effect a conventional procedure is to provide so called "underfill" in the very small space between the substrate and IC chip, using capillary forces. However, this requires that the vias are completely filled to be hermetically sealed such that there will be no leakage of underfill between the stacked structures, which could lead to improper underfill, degradation of the final product, reliability issues and packing issues, rendering final product useless.

Thus, it is desirable to provide filled vias. However, filling conventional vias with metal again will bring the thermal expansion effects into play, in particular if they were to be provided directly beneath the IC chip.

Also, as mentioned above, from a processing point of view, the thickness of the substrate normally cannot be as small as 100 μm without the use of carriers, but rather 300 μm and more is more reasonable not requiring carriers. However, for 300 μm thick wafers it is difficult not to say impossible to make void free hermetically tight vias of the size desirable, e.g. 15-100 μm in diameter, that extend through the substrate, in a cost efficient manner, i.e. in volume production.

In FIG. 3 there is shown a prior art structure disclosed in applicants own WO 2007/089206 A1. Here, routing 125 from a via to a contact pad 123 on a remote location on the substrate 120 is provided by a two-step etching process, wherein via holes 124 are first made, and then recesses 125 are made in a subsequent step. These routing structures will be in-plane and the vias are filled 126. Thermal expansion issues may occur if high density TSVs of this design are to be used.

In FIG. 4 another prior art via structure is shown, details of which are disclosed in applicants own WO 2010/059118. This via structure comprises a wide and deep part 401 extending form one side BS of the wafer 400, and a shallow and narrow part 402 extending from the other side FS (open vias). When the via is metallized 404, only the walls 406 of the wide part is covered (referred to as a "liner via") whereas the narrow part 402 is completely filled. This structure is advantageous in that thermal effects due to different expansion properties of metal and silicon will not have a major influence despite close-packing of the vias. It also requires less process time with regards to Electrochemical deposition (ECD) of metal (e.g. Cu) than prior art "bottom-up" plated blind TSVs.

When routing layers are provide on a structure as the one above, a disadvantage is that it results in topography causing passivation issues and more difficult post-processing with second RDL and/or micro-bump fabrication.

In EP-2 165 362 (AAC Microtec AB) a process referred to as the XiVia™ process is disclosed. In this process KOH etching is used and when it is scaled to higher densities (i.e. smaller holes with larger aspect ratios) there will be problems with uniformity and removal of the seed layer used in ECD plating step.

SUMMARY OF THE INVENTION

In view of the demands mentioned above and the shortcomings of the state of the art technology, the inventors have devised new structures and methods which overcome the drawbacks of the prior art.

Thus, in a first aspect there is provided a structure comprising close-packed vias and re-distribution layer(s) (RDL) or routings that are "in-plane", i.e. flush with surrounding substrate surface. This structure is defined in claim 1.

In another aspect there is provided an interposer comprising a structure according to claim 1, and which is defined in claim 5.

In a further aspect there is provided a method of making a structure having close-packed vias and re-distribution layer(s) (RDL) or routings that are "in-plane", i.e. flush with surrounding substrate surface. This method is defined claim 6.

Embodiments are defined in the dependent claims.

Thus, in a first aspect the invention provides a Semiconductor structure comprising close-packed vias and re-distribution layer(s) (RDL) or routings that are essentially flush with surrounding substrate surface, comprising a substrate of a semiconductor material having a first side and an opposite second side, at least one conductive wafer-through via comprising metal, wherein the conductive wafer-through via comprises two parts, a first narrow part extending from the first side, and a second wide part extending from the second side, and wherein the first narrow part is completely filled with metal, whereas the interior of the wide part is coated with metal only on the inner surfaces thereof, at least one narrow recess provided in the surface of the first side of the substrate and in the semiconductor material of the substrate, said recess extending in the plane of the substrate from the via to a point at a distance from the via, the recess being filled with metal to provide routing connected with the wafer-through via, wherein the exposed surfaces of the metal filled via and the metal filled recess are essentially flush with the substrate surface on the first side of the substrate.

In a second aspect there is provided an interposer comprising a structure according to claim 1, wherein the wafer-through via comprises a first narrow portion extending from the first side of the substrate, and is filled with metal and hermetically sealed, and a second wide portion extending from the second side of the substrate and covered with metal only on its inner surfaces, and further comprising routing structures on the second side of the substrate, contact members provided on the metal in the recesses on the first side, preferably in the form of micro sized copper pillars or solder bumps or a combination, contact members on the second side routing structures, preferably in the form of solder bumps, suitably ball grid arrays, and wherein the thickness of the interposer is >300 μm.

In a further aspect there is provided a method of making a semiconductor structure, comprising providing a substrate of a semiconductor material having a first side and a second side patterning the first side of the substrate to provide a first mask 15 for a recess in the semiconductor material of the substrate, patterning the substrate to provide a second mask for a blind hole having a high aspect ratio AR, i.e. AR=depth:width>1:1, etching through said second mask to provide a blind hole in the substrate, etching through the first mask to provide said recess in the substrate and to round off the edges of the hole, further comprising making a hole from the second side of the substrate either before the step of patterning to provide said first mask on the first side or after the blind hole is made, wherein the second side hole is made to a depth and at location matching the depth and location of the first side blind hole, such that a wafer-through hole is created, depositing metal to fill said hole and said recess and further comprising applying a chemical-mechanical polishing process to planarize the substrate and to define the redistribution layer (routing).

The deposition of metal can be done by electroplating or chemical plating, whereby the substrate is treated to provide a basis for such plating, and the step of treating the substrate to provide a basis for electroplating can comprise applying a seed layer. The seed layer can suitably comprise a layer of Ti, TiN, TaN, TiW or Ni and a layer of Cu, preferably deposited by MOCVD, ALD or PVD. Also, suitably there is provided an insulating layer under the metal coating before the deposition of metal.

The method exhibits similarities with the well-know so called "double damascene process". However, the present method is greatly advantageous since the process is performed in the wafer surface, and thereby the planarity of the end product is achieved, whereas, in the double damascene process the entire processing is performed on the surface of the wafer, resulting in topography. Also, the via and routing (RDL) structures are made in the same step thereby creating a seamless structure.

BRIEF DESCRIPTION OF THE DRAWINGS

Further scope of applicability of the present invention will become apparent from the detailed description given hereinafter and the accompanying drawings which are given by way of illustration only, and thus not to be considered limiting on the present invention, and wherein
FIGS. 2a-i illustrates further processing.

DETAILED DESCRIPTION OF PREFERRED EMBODIMENTS

The present invention sets out to provide wafers with hermetically sealed and close-packed vias and with in-plane routing patterns, seamlessly connected with the vias, such that the advantages of both of the above described prior art structures are combined in one structure.

Figure 3:
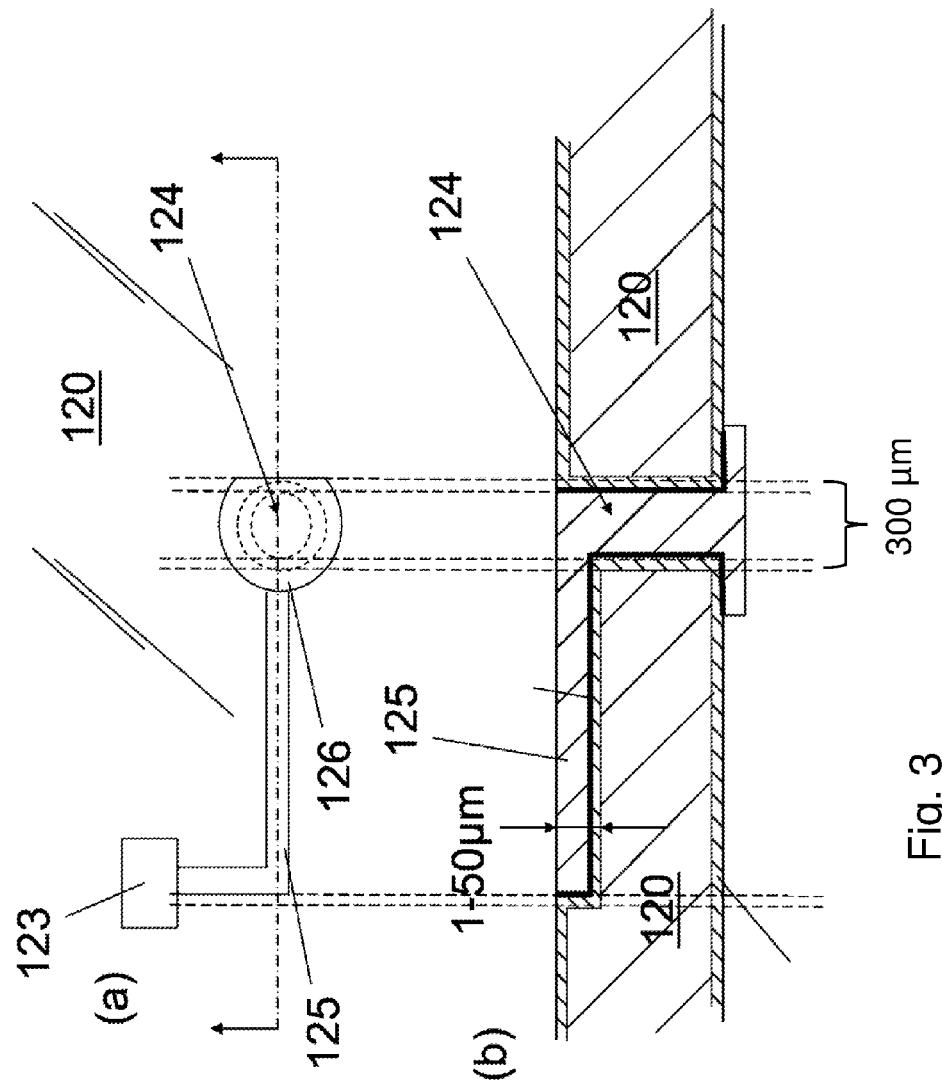
FIG. 3 shows a prior art structure wherein the routing from a via is in-plane.
Figure 4:
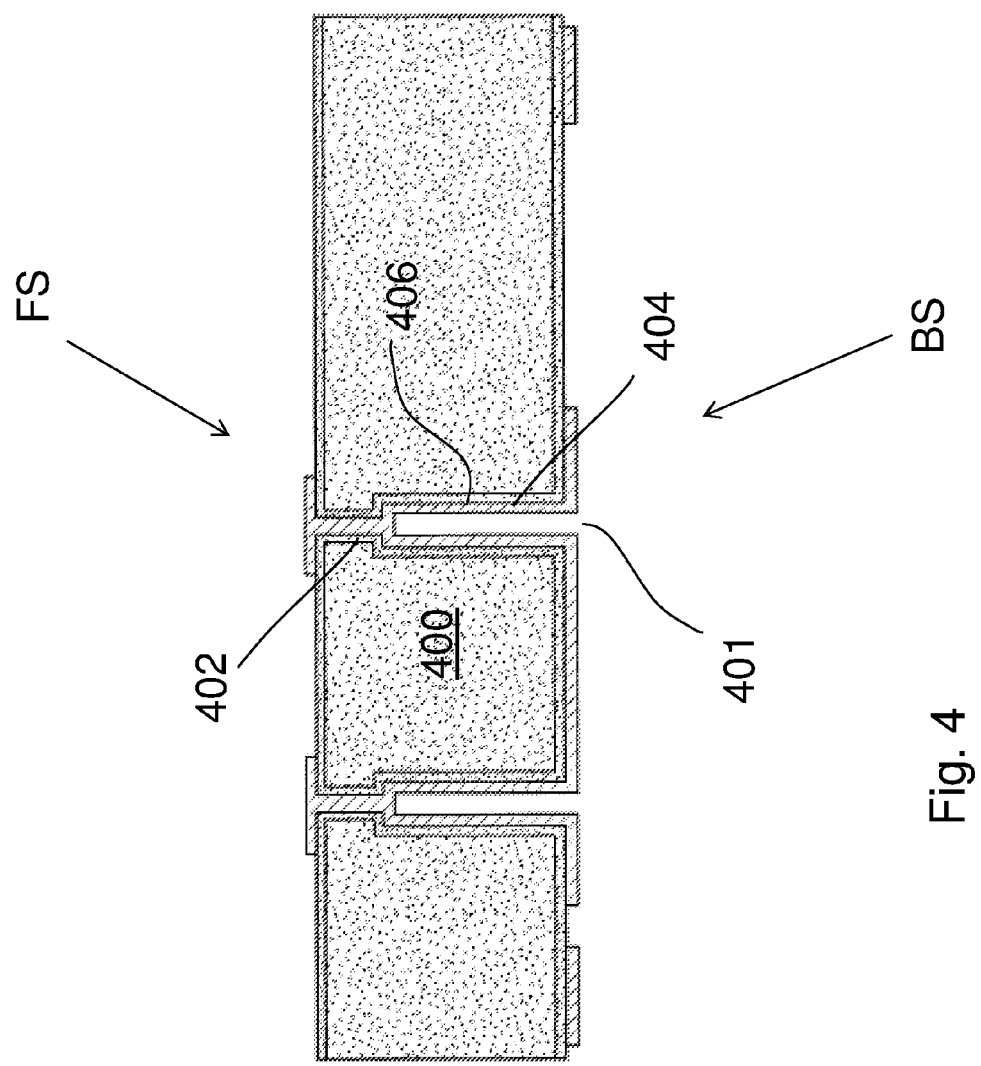
FIG. 4 illustrates a prior art via comprising a wide part and a narrow part wherein only the narrow part is filled with metal.

The prior art structure according to FIG. 3 comprises a conventional metal via 124 with routing 125 and contact pad 123 in a wafer 120, where the diameter of the via is in the order of 300 μm and the thickness of the routing is 1-50 μm. This structure is fairly easy to manufacture so long as the pitch, i.e. center-to-center distance between vias is not too small. Density of vias is of course also important. For a "fully propagated" wafer wherein the pitch is in the range of twice the diameter of the vias thermal stress effects may easily cause damage to the substrate, both during manufacture and use.

Consequently, if it is desired to provide more closely packed via structures the diameter of the via holes must be reduced. However, for small diameters it becomes very difficult with common prior art technologies like PVD (Physical Vapour Deposition) to provide the seed layer in the holes if the aspect ratio (Depth/Width) is high, i.e. is more than 2:1, and even for aspect ratios down to 1:1 it may be difficult, due to the nature of the PVD process and step coverage. The seed layer on the field (i.e. the planar part of the surface of the wafer) where the RDL are to be made needs to be thick and therefore makes densely packed redistribution wires with small feature size difficult to obtain, when the seed layer is to be removed by wet etching processes.

According to the invention this problem is solved by using an etching procedure which herein is referred to as a "trumpet etch". This procedure is performed after the via hole has been made by conventional lithography, and entails subjecting the wafer to a further etch after the mask defining the hole has been removed.

Thus there is provided a semiconductor structure, comprising a substrate of a semiconductor material having a first side (FS) and an opposite second side (BS); at least one conductive wafer-through via comprising metal; at least one recess provided in the first side of the substrate and in the semiconductor material of the substrate, the recess being filled with metal and connected seamlessly with the wafer-through via; wherein the exposed surfaces of the metal filled via and the metal filled recess are essentially flush with the substrate surface on the first side of the substrate.

There is also provided a method of making a semiconductor structure, comprising providing a substrate 10; 30, 31,32, 33 of a semiconductor material having a first side FS and a second side BS, patterning the first side FS of the substrate to provide a first mask 15 for a recess in the semiconductor material of the substrate, patterning the substrate to provide a second mask 15' for a blind hole having a high aspect ratio AR, i.e. AR=depth:width>1:1, etching through said second mask 15' to provide a blind hole 18; 36 in the substrate, etching through the first mask 15 to provide said recess 20; 37 in the substrate and to round off the edges of the hole 18; 36, further comprising making a hole from the second side of the substrate either before the step of patterning to provide said first mask on the first side or after the blind hole is made, wherein the second side hole is made to a depth and at a location matching the depth and location of the first side blind hole, such that a wafer-through hole is created, depositing metal 27; 44 to fill said hole 18; 36 and said recess 20; 37 and further comprising applying a chemical-mechanical polishing process to planarize the substrate.

This procedure can be used in accordance with the present invention also for providing very narrow routing structures in the following way, the description being given with reference to FIGS. 1a-1f.

Figure 1A:
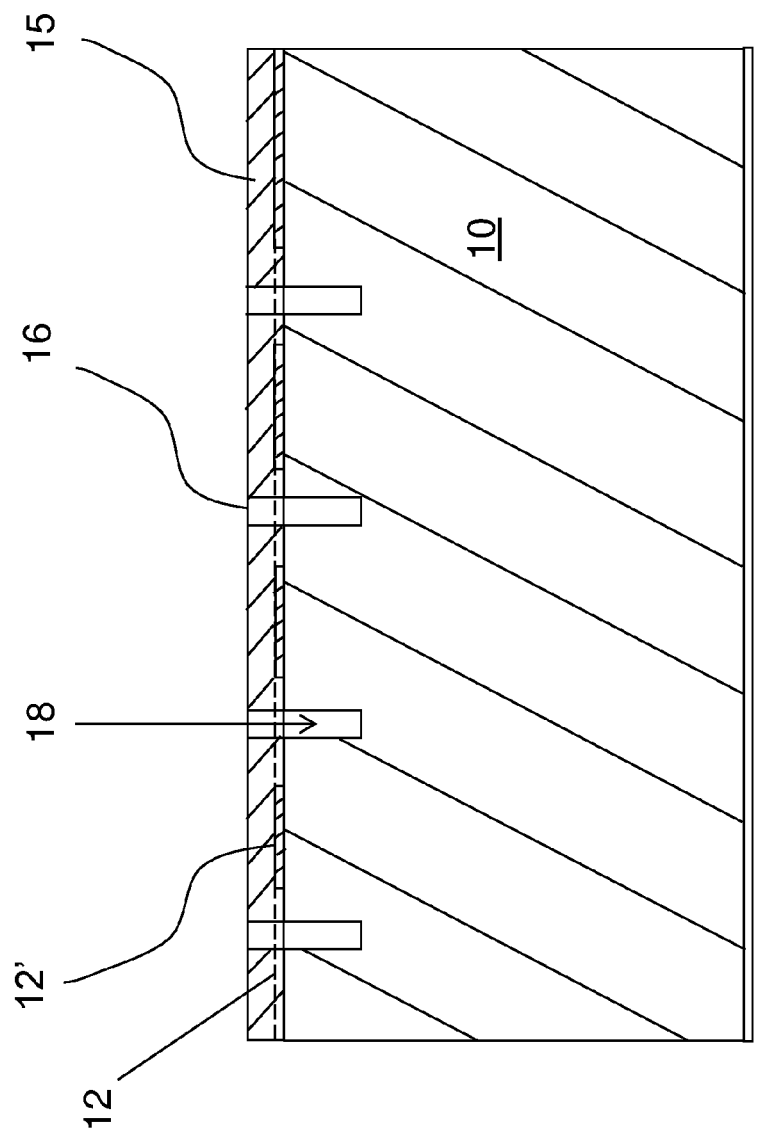
FIGS. 1a-1c shows a process scheme.

Namely, initially the substrate 10, which is in the range of 300 μm thick, is provided with a very thin oxide layer 12 (of the order of 1 μm thick), see FIG. 1a (the presence of the oxide before further processing of the wafer is indicated with a broken line), suitably a thermal oxide provide by heating in an oxidizing atmosphere. In this oxide layer an etch mask 12' is defined by lithography in conventional manner by applying resist (not shown). This mask is patterned to define both the routing structure (re-distribution layer) and the via structure. The mask is used to etch away oxide 12 down to the silicon substrate 10, according to the lithographic mask pattern 12'. Thereby narrow recesses are made defining the final routing lines (not shown) and spots are made defining the area where the via hole is to be made. By virtue of using the oxide as the mask for the routing recesses, these can be made very narrow, e.g. down to 0.1 μm to a depth of about 10 μm or more, preferably 0.6-5 μm. It should be noted that the spot defining the via is larger in diameter than the actual wafer through via hole, in order to enable later processing according to the invention, which will be described below.

The first resist is stripped by applying a plasma etch, and then a new resist 15 is spun onto the wafer at a thickness of e.g. 1-2 μm, as shown in FIG. 1a, allowing all patterns to be defined by lithography on wafer with limited topography and thereby allowing small features (submicron scale). Now openings 16 are made in the resist 15 down to the silicon substrate, the diameter of openings being equal to the desired diameter of the actual wafer through via, i.e. in the order of 5-20, preferably 12-16 μm in diameter A DRIE (Deep Reactive Ion Etch) is applied for about 1-15 minutes to provide holes 18 to a depth of about 25 μm. The resist 15 is then plasma stripped to expose the patterned oxide 12'.

Figure 1B:
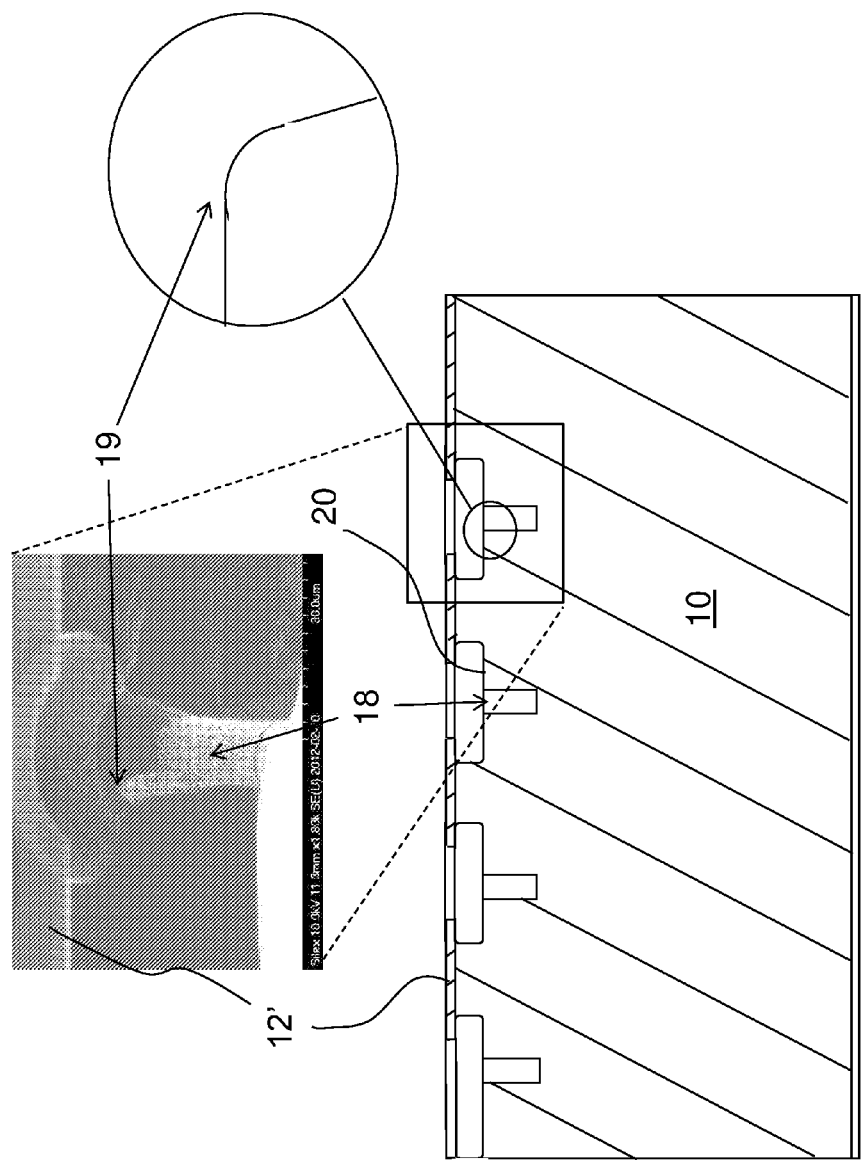

Now, with reference to FIG. 1b, when the resist has been removed, a "trumpet" etch (DRIE) is performed, selectively on the semiconductor exposed through the oxide mask 12', whereby the circumferential top edge of the via hole will be slightly rounded off (tapered hole profile 19), as shown in magnification in the insert in FIG. 1b. Also a "collar" 20 around the via hole 18 is created. Since the isotropic DRIE step will act in all directions, material will be removed from under the mask 12' as can be seen in FIG. 1b. During the trumpet etch also the routing recesses will be provided in the substrate since they are also defined by the mask 12'. The trumpet etch will excavate material to a depth in the range of a few μm.

The rounding of the edges and formation of the "tapered" profile of the via holes 18, which is clearly discernible in the insert in FIG. 1b, will facilitate the coating of the holes with seed metal despite the diameter being very small. This is an alternative process forming the XiVia structure outlined in the prior art shown in EP-2 165 362 (AAC Microtec AB).

After the trumpet etch the wafer is cleaned to remove any particles and polymers remaining from the DRIE process by rinsing, and then the oxide mask 12' is removed by stripping with HF, whereby a structure is arrived at, which comprises a wafer 10 having holes 18 with a collar 20 provided in one side thereof. This structure could be said to constitute a mold for the subsequent provision of metal in the routing and via structures.

Figure 1C:
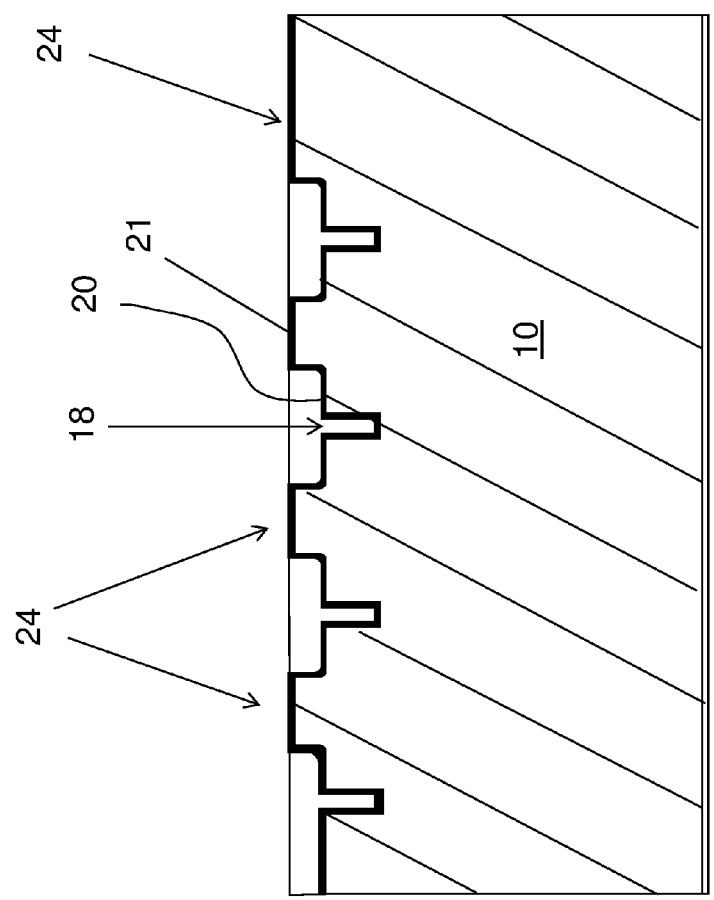

It is necessary to provide an insulation between the substrate and the metal in the finished via structure. To this end the wafer is again provided with an insulating layer, such as by providing a thick oxide layer 21. Suitably this is achieved by thermally growing at high temperature or by deposition at low temperature, as shown in FIG. 1c.

The oxide layer 21 is suitably e.g. a few μm thick covering all surfaces, i.e. both the field (i.e. the planar part 24 of the substrate), the holes 18 and the collars 20, on which optionally a nitride layer 22 (FIG. 1d), about 0.1 μm (1000 Å) thick, and optionally other low-k thick insulation materials (e.g. polymers such as Polyimide or similar materials) is/are applied by methods well known to the skilled man. The nitride layer 22 is a barrier against diffusion of copper (plated in a later step) into the silicon, and also as a barrier to moisture. As an alternative to oxidation, the insulating (oxide) layer can be applied also by other well known methods. It is important that this insulation layer has a selectivity to Cu in the following CMP process.

In order to be able to electroplate metal in the via hole it is necessary to provide a seed layer on the insulation. Such a seed layer preferably comprises Ti, TiN, TaN, TiW, TiWN or Ni and a layer of Cu or Ru, but also other conductive materials compatible with copper plating are possible. The seed layer is preferably applied by sputtering (PVD) or ALD or MOCVD, but any other method that meets the conditions are possible. However, in order to provide a good seed layer, i.e. step coverage on high aspect ratio via holes it preferably comprises a first 0.5 µm (5000 Å) thick (although it can also be made thinner) Ti layer for providing adhesion, onto which subsequently a 0.5 µm (5000 Å) thick Cu layer is applied. This is illustrated in FIG. 1*d* as one layer 23.

However, numerous other materials and thicknesses well known in the art can be used. For example, TiN, TaN as barrier/adhesion and other conductive layers.

The advantage with this approach over the prior art process disclosed in WO 2010/059118 using laminate resist mold plated routings/RDL is that one can use whatever thickness one wants or even other conductive materials than wet etchable Ti Cu as seed materials, as long as they are possible to remove later on in the CMP step. Other deposition technologies (e.g. ALD) can also be used.

To shrink the via dimensions (via aspect ratio>5:1) one needs 1-3 µm Cu on the field, i.e. the planar part 24 of the substrate, to be able to get enough thickness on via walls with sputtered seed. Thick field seed layer is a huge problem for wet etch seed but less of a concern for the CMP approach. The small RDL structure sizes defined by mask layer remains unaffected by CMP process, while wet etching seed layer approach will affect the critical dimensions especially for thick seed layers, i.e. >9 µm.

When the seed layer has been properly provided, copper or gold or other material is electroplated as follows.

In a final step chemical polishing (CMP) is applied to planarize the wafer and to remove the excess metal 27 such that the vias V and RDL structures are provided as "inlays" or "in-plane structures" in the wafer surface, as schematically illustrated in FIG. 1*f*. Thus, the metal surface of the routing recesses that is exposed and also the top surface of the via will be flush with the surface 24 of the surrounding substrate making further RDL and/or bumping post processing easier.

In order to provide such electrical connection, the principle disclosed in the previously mentioned WO 2010/059118 is used.

Namely, a deep and wide hole is made in the substrate from the back side (i.e. the opposite side from where the RDL and via holes describe above are located). These deep and wide holes are made in an initial process before the process described in connection with FIGS. 1*a*-1*f* above.

Figure 2A:
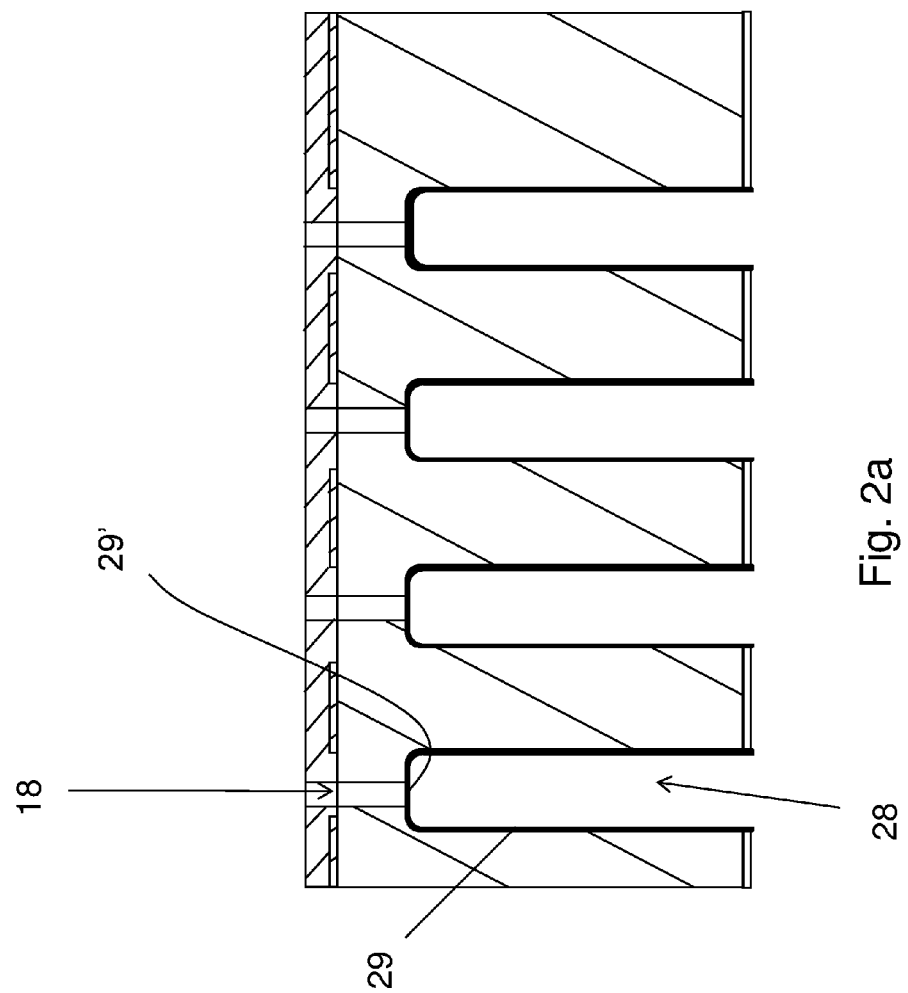

Thus, as shown in FIG. 2*a*, holes 28 are etched in the wafer and the walls of these holes will of course also be oxidized to provide an oxide layer 29 in the same oxidation step as described above in connection with FIG. 1*a*.

During the processing shown in FIGS. 1*a*-1*b*, when performed after the holes 28 were made, the holes 28 are unaffected, but beginning with the step shown in FIG. 1*c*, but before the oxide layer 21 is provided, the holes 28 will be subjected to the same processing as the other surfaces of the substrate. However, as can be seen in FIG. 2*a*, the oxide layer 29 in the large backside via holes 28 will act as an etch stop 29' for the provision of the smaller holes 18. This oxide "stop" must be removed before further processing can be made, and thus suitably an HF stripping is applied to remove all oxide. This will correspond to the process illustrated with reference to FIG. 1*b*, and is in practice the same, i.e. no separate step is required for removing the "etch stop" 29'.

Figure 2B:
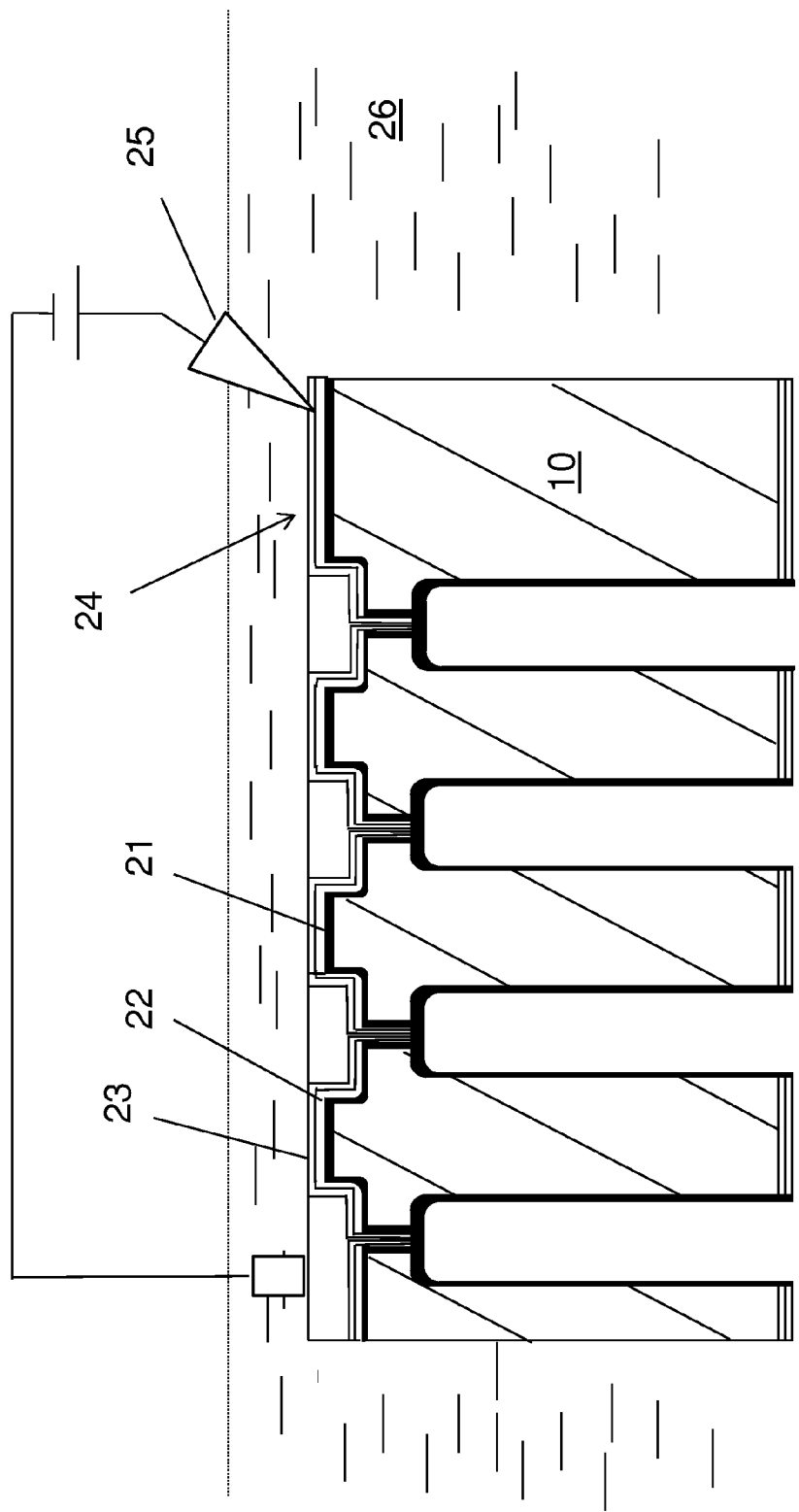

Therefore, the provision of the seed layer will be the same for the embodiment according to FIGS. 2*a*-*b*, and consequently also the plating.

Figure 2C:
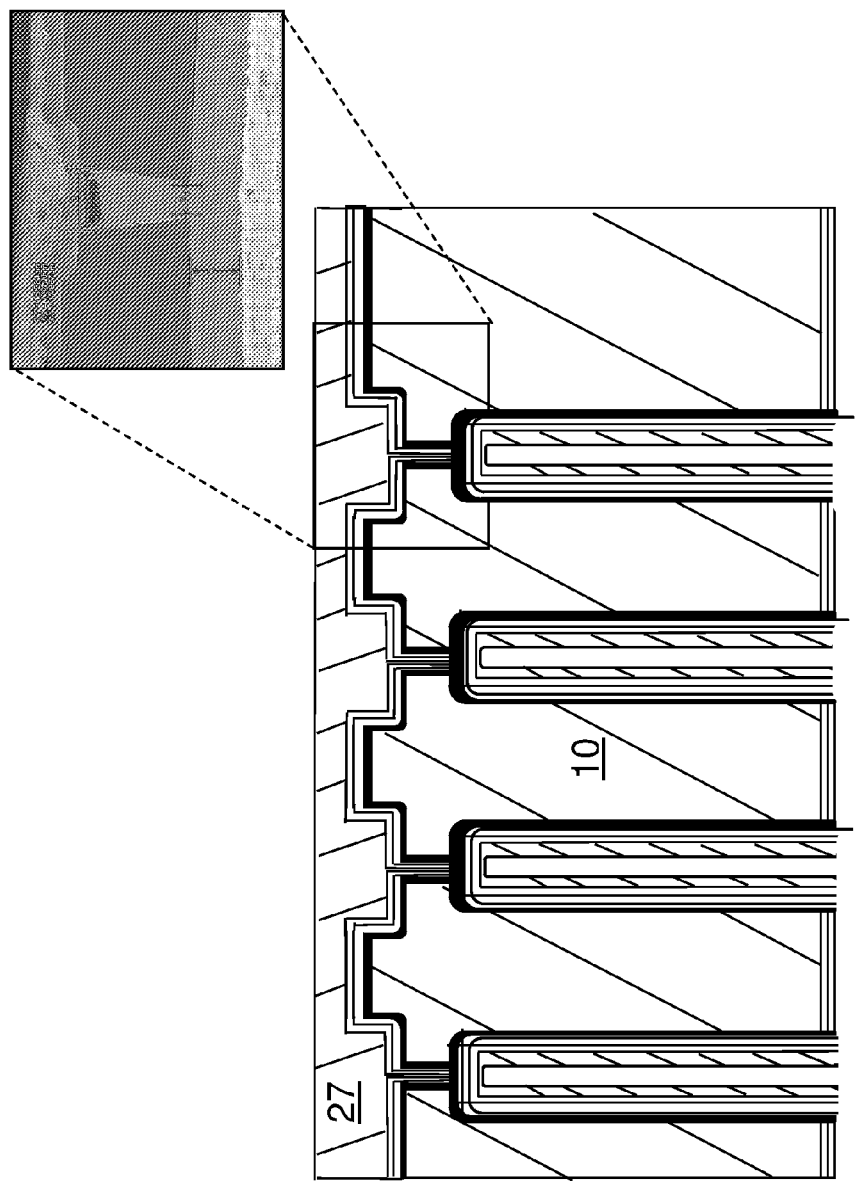
Figure 2D:
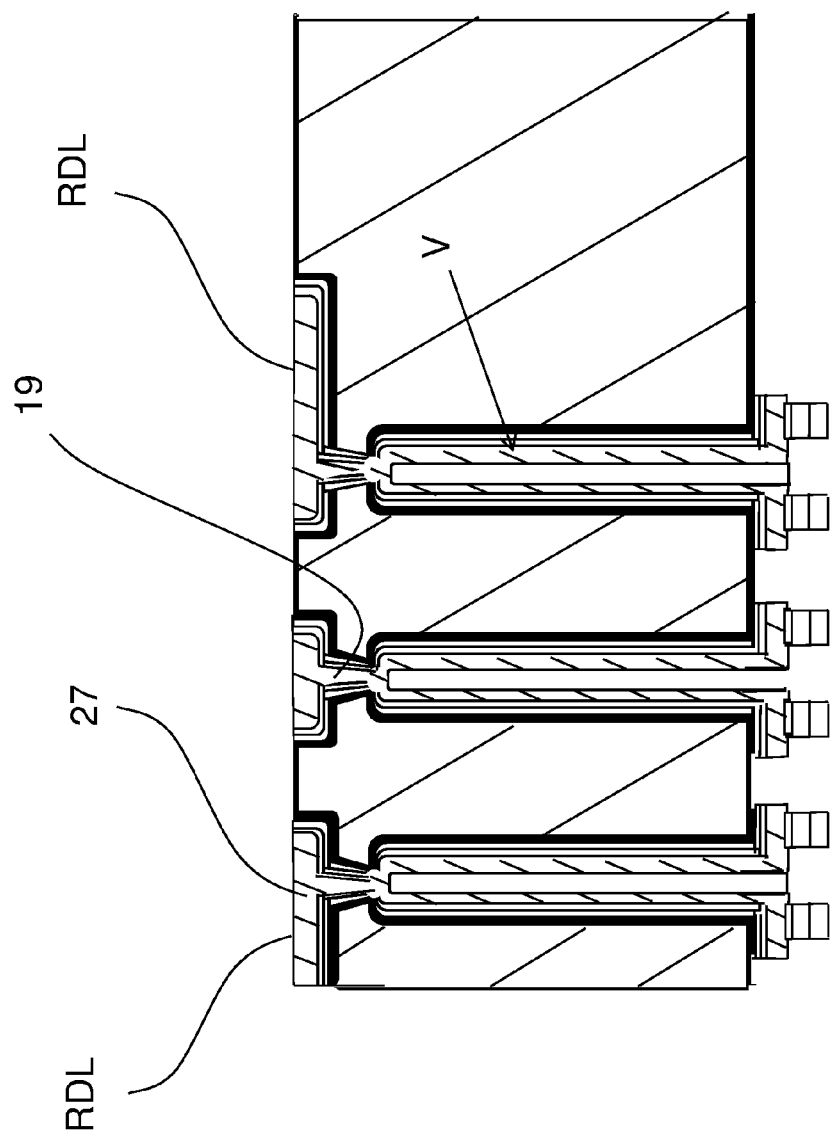

After processing to obtain a structure essentially according to FIG. 1*c* i.e. a narrow hole and recesses on a first side (not shown in FIG. 2*a*) and wide holes on the opposite side, plating is performed, see FIGS. 2*b*-*d*.

Thus, an electrode 25 is attached to the top side, i.e. on the field part 24 of the wafer from FIG. 2*b*1*c*, and the wafer is immersed in an electroplating bath 26 containing copper ions, schematically shown in FIG. 2*b*.

Electroplating, suitably pulse plating with appropriate configuration using additives (suppressors, accelerators and brighteners), at typically 5-10 V, at a current of 20-80 mA/cm² for about 1-25 minutes will fill the via holes 18 as well as the routing structures with metal 27, and the plating is allowed to continue until the entire wafer is covered, as shown in FIG. 2*c*. Of course other plating variables and plating modes, including electroless deposition, are usable depending on system characteristics. A bottom up filling process is preferred over wall plating in order to avoid a seam when the hole is filled.

Thus, the final structure after polarization, where the wafer-through connections or vias V and routing structures RDL, filled with metal 27, are provided is shown in FIG. 2*d*. Here also the tapered hole profile 19 obtained by the trumpet etch is shown.

The actual shape of the holes 28 is not necessarily exactly as shown in FIGS. 2*a*-*b*.

In reality the via holes comprises a first portion and a second portion that form a constriction with at least an upper sloping sidewall widening out towards the upper side in the hole, said first portion having a substantially vertical sidewall.

Figure 2E:
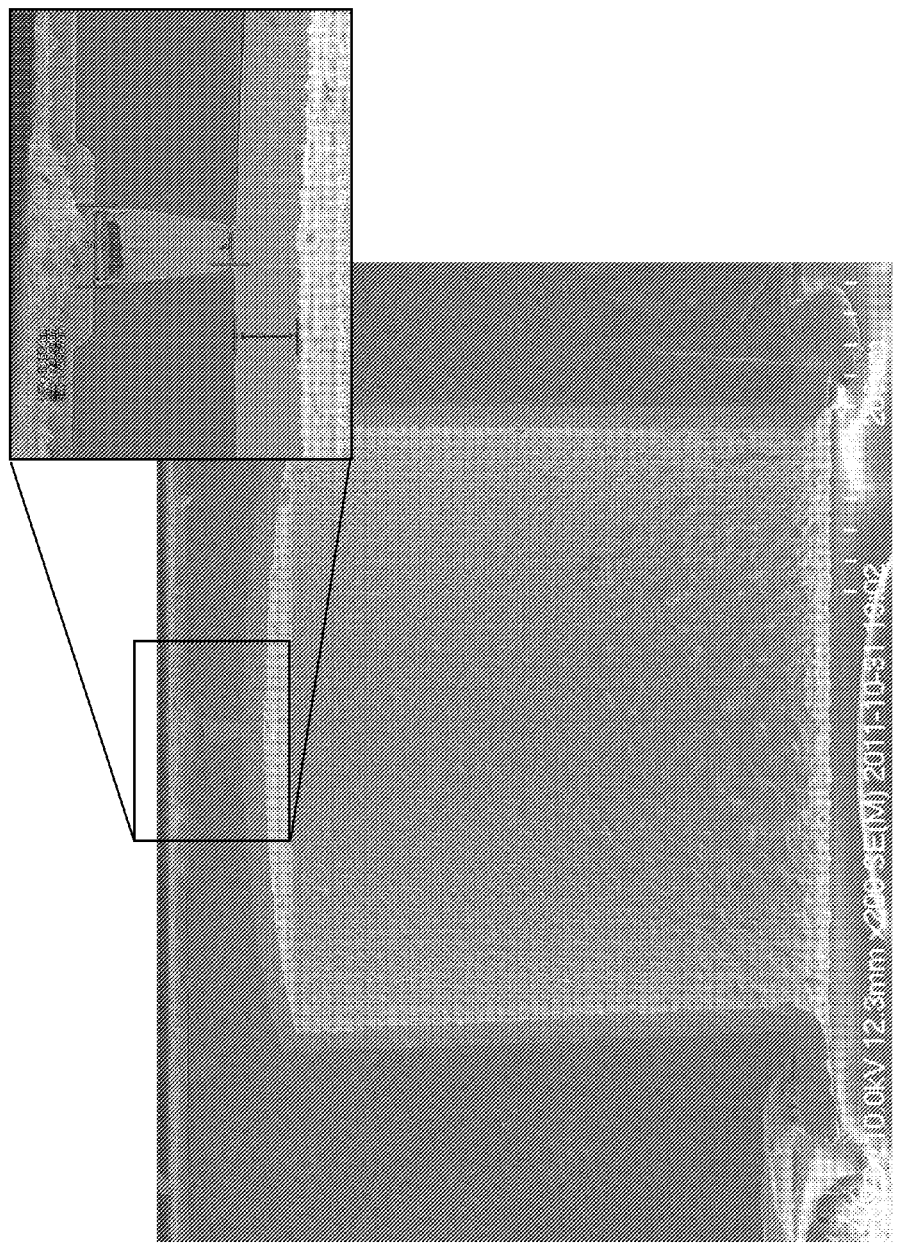

A SEM picture showing a typical structure is shown in FIG. 2*e* as an insert.

Suitably also a flat backside surface collar 30 is also made in the same way as the front side, as illustrated in FIG. 2*f*, to make "bumping" 31 easier.

FIG. 2*g* is a schematic illustration from above of the structure according to FIG. 2*f*, showing an example of a lay-out of routing RDL structures and vias V.

The structure as described in connection with FIG. 2*f* is also a good starting point, i.e. flat or with minimum topography, which facilitates integration of multi-RDL 32 using for example the well known double damascene process, as illustrated in FIG. 2*h* where three additional RDLs have been processed (two signals and two VDD/VCC and GND).

Figure 2I:
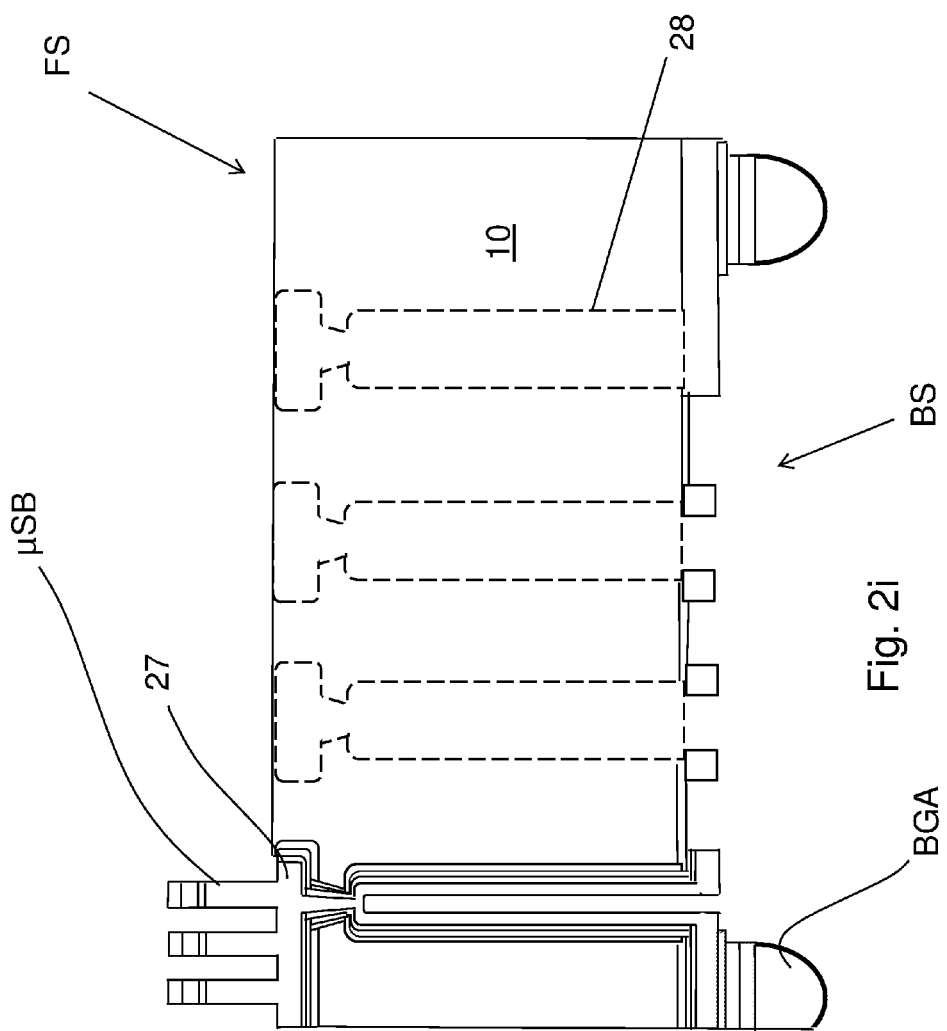

In FIG. 2*i* there is shown an application of the embodiment described above. Only one via and routing structure is shown in some detail, the others only schematically. It comprises a plurality of micro solder bumps µSB on the front side routings and ball grid arrays BGA on the back side routings. This structure constitutes an interposer for interconnecting e.g. circuit boards and micro electronic circuitry.

The above process is usable for relatively thick substrates 10, i.e. exhibiting a thickness in the order of 200 µm and more, which is rigid enough wafer to be handled by automatic semiconductor handling without the need for stabilizing carrier solution.

The invention claimed is:

1. A method of making a semiconductor structure, comprising:
   providing a substrate of a semiconductor material having a first side (FS) and a second side (BS);
   patterning the first side (FS) of the substrate to provide a first mask for a recess in the semiconductor material of the substrate;
   patterning the substrate to provide a second mask for a blind hole having a high aspect ratio AR, i.e. AR=depth:width>1:1;

etching through said second mask to provide a blind hole in the substrate;

etching through the first mask to provide said recess in the substrate and to round off the edges of the hole;

further comprising:

making a hole from the second side of the substrate either before the step of patterning to provide said first mask on the first side or after the blind hole is made;

wherein the second side hole is made to a depth and at location matching the depth and location of the first side blind hole, such that a wafer-through hole is created;

depositing metal to fill said hole and said recess;

further comprising applying a chemical-mechanical polishing process to planarize the substrate; and integrating a multi-layer routing structure on said planarized substrate.

2. The method according to claim 1, wherein the substrate is a wafer, having a device layer on which there is an oxide layer and a handle portion.

3. The method according to claim 2, wherein the wafer is a SOI wafer.

4. The method according to claim 2, wherein the handle portion is a temporary carrier attached to the oxide layer.

5. The method according to claim 4, comprising removing the temporary carrier.

6. The method according to claim 2, comprising removing the handle portion from the substrate wafer and providing routing structures to the opposite side form said planarized surface, and providing solder bumps to said routing structures.

7. The method according to claim 1, comprising providing solder bumps to the routing structure formed after planarization.

8. The method according to claim 7, comprising attaching a temporary carrier on the side of the substrate wafer comprising said solder bumps.

9. The method according to claim 1, wherein the deposition of metal is by electroplating or chemical plating, whereby the substrate is treated to provide a basis for such plating.

10. The method according to claim 9, wherein the step of treating the substrate to provide a basis for electroplating comprises applying a seed layer.

11. The method according to claim 10, wherein the seed layer comprises a layer of Ti, TiN, TaN, TiW or Ni and a layer of Cu, preferably deposited by MOCVD, ALD or PVD.

12. The method according to claim 1, comprising providing an insulating layer under the metal coating before the deposition of metal.

13. The method according to claim 1, wherein the multi-layered routing structure is provided by a double damascene process.

14. The method according to claim 1, further comprising providing contact members on the metal in the recesses on the first side (FS), preferably in the form of micro sized copper pillars or solder bumps or a combination.

* * * * *